United States Patent
Chmelar et al.

(10) Patent No.: US 8,121,186 B2
(45) Date of Patent: Feb. 21, 2012

(54) SYSTEMS AND METHODS FOR SPECULATIVE SIGNAL EQUALIZATION

(75) Inventors: Erik Chmelar, Midland, MI (US); Choshu Ito, San Mateo, CA (US); William Loh, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 840 days.

(21) Appl. No.: 12/134,501

(22) Filed: Jun. 6, 2008

(65) Prior Publication Data

US 2009/0304066 A1   Dec. 10, 2009

(51) Int. Cl.
*H03H 7/30* (2006.01)
*H03H 7/40* (2006.01)
*H03K 5/159* (2006.01)

(52) U.S. Cl. ...................................... 375/233
(58) Field of Classification Search ............... 375/229, 375/232, 233, 265, 317, 345, 348, 350, 359, 375/373; 341/118, 120, 155, 159, 160, 161
See application file for complete search history.

(56) References Cited

U.S. PATENT DOCUMENTS

| | | | |
|---|---|---|---|
| 4,672,518 A | 6/1987 | Murdock | |
| 4,686,617 A | 8/1987 | Colton | |
| 4,837,495 A | 6/1989 | Zansky | |
| 4,885,674 A | 12/1989 | Varga et al. | |
| 4,918,450 A | 4/1990 | Sugiyama et al. | |
| 5,005,189 A * | 4/1991 | Hackett, Jr. | 375/348 |
| 5,052,000 A * | 9/1991 | Wang et al. | 714/758 |
| 5,072,221 A | 12/1991 | Schmidt | |
| 5,097,486 A * | 3/1992 | Newby et al. | 375/317 |
| 5,182,477 A | 3/1992 | Ito | |
| 5,173,698 A | 12/1992 | Gulczynski | |
| 5,225,837 A | 7/1993 | Hosotani et al. | |
| 5,272,701 A | 12/1993 | Tsuruoka | |
| 5,296,856 A | 3/1994 | Mantong | |
| 5,418,493 A | 5/1995 | Dijkmans | |
| 5,510,745 A | 4/1996 | Hamano et al. | |
| 6,008,356 A | 10/1997 | Cooper | |
| 5,689,178 A | 11/1997 | Otake | |

(Continued)

OTHER PUBLICATIONS

U.S. Appl. No. 12/024,893, filed Feb. 1, 2008, Bailey.

(Continued)

*Primary Examiner* — Kevin M. Burd
*Assistant Examiner* — Syed Haider
(74) *Attorney, Agent, or Firm* — Hamilton DeSanctis & Cha

(57) ABSTRACT

Various embodiments of the present invention provide systems and methods for signal equalization, and in some cases analog to digital conversion. For example, an analog to digital converter is disclosed that includes a comparator bank that receives a reference indicator and is operable to provide a decision output based at least in part on a comparison of an analog input with a reference threshold corresponding to the reference indicator. A range selection filter is included that has a first adjustment calculation circuit and a second adjustment calculation circuit. The first adjustment calculation circuit is operable to calculate a first adjustment feedback value based at least in part on a speculation that the decision output is a first logic level, and the second adjustment calculation circuit is operable to calculate a second adjustment feedback value based at least in part on a speculation that the decision output is a second logic level. A selector circuit selects the first adjustment feedback to generate the reference indicator when the decision output is the first logic level, and selects the second adjustment feedback to generate the reference indicator when the decision output is the second logic level.

24 Claims, 7 Drawing Sheets

U.S. PATENT DOCUMENTS

| | | | |
|---|---|---|---|
| 5,734,297 | A | 3/1998 | Huijsing et al. |
| 5,789,973 | A | 8/1998 | Barrett et al. |
| 5,801,564 | A | 9/1998 | Gasparik |
| 5,809,060 | A | 9/1998 | Cafarella et al. |
| 5,861,829 | A | 1/1999 | Sutardja |
| 5,874,911 | A * | 2/1999 | Kodama .................. 341/156 |
| 5,929,705 | A | 7/1999 | Zhang et al. |
| 5,936,466 | A | 8/1999 | Andoh et al. |
| 6,002,356 | A | 12/1999 | Cooper |
| 6,011,502 | A | 1/2000 | Kao |
| 6,081,219 | A | 6/2000 | Prasanna |
| 6,111,467 | A | 8/2000 | Luo |
| 6,181,269 | B1 | 1/2001 | Nishiuchi et al. |
| 6,225,859 | B1 | 5/2001 | Irvine et al. |
| 6,232,908 | B1 | 5/2001 | Nakaigawa |
| 6,369,743 | B2 | 4/2002 | Ono |
| 6,373,423 | B1 * | 4/2002 | Knudsen .................. 341/159 |
| 6,404,372 | B1 | 6/2002 | Heithoff |
| 6,404,374 | B1 | 6/2002 | Yu et al. |
| 6,459,394 | B1 * | 10/2002 | Nadi et al. .................. 341/120 |
| 6,556,081 | B2 | 4/2003 | Muza |
| 6,556,158 | B2 | 4/2003 | Steensgaard-Madsen |
| 6,563,445 | B1 | 5/2003 | Sabouri |
| 6,580,382 | B2 | 6/2003 | Yung |
| 6,600,373 | B1 | 7/2003 | Bailey et al. |
| 6,605,993 | B2 | 8/2003 | Suziki |
| 6,653,966 | B1 | 11/2003 | Mulder et al. |
| 6,717,945 | B1 | 4/2004 | Jue et al. |
| 6,744,432 | B1 | 6/2004 | Morein |
| 6,756,841 | B2 | 6/2004 | Jaussi et al. |
| 6,784,824 | B1 | 8/2004 | Quinn |
| 6,816,101 | B2 | 11/2004 | Hietala et al. |
| 6,922,083 | B2 | 7/2005 | Tanaka et al. |
| 6,956,519 | B1 | 10/2005 | Huang et al. |
| 7,002,504 | B2 | 2/2006 | McMahill |
| 7,019,507 | B1 | 3/2006 | Dittmer et al. |
| 7,116,260 | B2 | 10/2006 | Luh |
| 7,129,874 | B2 | 10/2006 | Bjornsen |
| 7,190,298 | B2 | 3/2007 | Mulder |
| 7,209,068 | B1 | 4/2007 | Chen et al. |
| 7,262,724 | B2 | 8/2007 | Hughes et al. |
| 7,333,580 | B2 | 2/2008 | Parhi |
| 7,362,153 | B2 | 4/2008 | Sumesaglam |
| 7,471,228 | B2 | 12/2008 | Cho et al. |
| 7,482,844 | B2 | 1/2009 | Brady et al. |
| 7,696,915 | B2 | 4/2010 | Chmelar |
| 2002/0186776 | A1 | 12/2002 | Cosand |
| 2005/0151588 | A1 | 7/2005 | Bailey et al. |
| 2005/0271169 | A1 * | 12/2005 | Momtaz et al. ............... 375/345 |
| 2006/0071709 | A1 | 4/2006 | Malobert |
| 2006/0097470 | A1 | 5/2006 | Chmelar |
| 2006/0132242 | A1 | 6/2006 | Han et al. |
| 2006/0220935 | A1 * | 10/2006 | Hughes et al. ................ 341/143 |
| 2007/0183006 | A1 | 8/2007 | Lee |
| 2008/0048896 | A1 | 2/2008 | Parthasarthy et al. |
| 2008/0069199 | A1 * | 3/2008 | Chen et al. ................... 375/233 |
| 2008/0187036 | A1 * | 8/2008 | Park et al. .................... 375/233 |
| 2008/0263970 | A1 | 10/2008 | Chmelar |

OTHER PUBLICATIONS

U.S. Appl. No. 12/025,987, filed Nov. 20, 2007, Bailey et al.
U.S. Appl. No. 12/025,914, filed Nov. 20, 2007, Bailey et al.
U.S. Appl. No. 12/134,488, filed Jun. 6, 2008, Chmelar.
U.S. Appl. No. 12/134,523, filed Jun. 6, 2008, Chmelar.
Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Diato et al., "A 14-bit 20-MS/s Pipelined ADC With Digital Distortion Calibration," IEEE J. Solid-State Circuits, vol. 41, No. 11, pp. 2417-2423.
Gupta, et al., "A 1 GS/s 11b Time Interleaved ADC in 0.13um CMOS", ISSCC Dig. Tech. Papers, pp. 576-577, Feb. 2006.
Kim et al., "A 10-b, 10MS/s CMOS A/D Converter", IEEE J. Solid State Circuits, vol. 32, No. 3, pp. 302-311, Mar. 1997.
Mehr, et al., "A 55-mW, 10-bit, 40 -Msample/s Nyquist-Rate CMOS ADC," IEEE J. Solid-State Circuits, vol. 35, No. 3, pp. 302-311, Mar. 2000.
Nagaraj et al., "A 250 mW 8-b, 52 Msamples/s Parallel-Pipelined A/D Converter with Reduced Number of Amplifiers", IEEE J. Solid State Cir., vol. 32, pp. 312-320, Mar. 1997.
Schinkel, Daniel et al. A double- Tail Latch-Type Voltage Sense Maplifier with 18ps Setup=Hold Time, Feb. 13, 2007, ISSCC 2007, Session 13, pp. 314-315 and 605 IEEE.
Schmid & Moschtz, "A Tunable, Video-Frequency, Low Power Single Amplifier Biquadratic Filter in CMOS", Circuits and Systems, 1999, ISCAS'99. IEEE Int. Sym. on vol. 2, May 2.
Sedra, Adel S. et al. "Optimum Configurations for Single-Amplifier Biquadratic Filters" Dec 1980, IEEE Trans. On Cir. and Sys., vol. CAS-27, No. 12, pp. 1155-1163.
Singer et al., "A 14-bit 10-MHz Calibrations-Free CMOS Pipelined A/D Converter," in Symp. VLSI Circuits Dig. Tech Papers, Jun. 1996, pp. 38-39.
Mangelsdorf, C.W., "A 400-MHz input flash converter with error correction", IEEE Journal of Solid-State Circuits, pp. 184-191, Feb. 1990, vol. 25 Issue: 1.
Katsuria, S. et. al., "Techniques for High-Speed Implementation of Nonlinear Cancellation", IEEE Joun. Communications, vol. 9, No. 5, Jun. 1991, pp. 711-717.

* cited by examiner

SYSTEMS AND METHODS FOR SPECULATIVE SIGNAL EQUALIZATION

BACKGROUND OF THE INVENTION

The present inventions are related to systems and methods for processing digital signals, and more particularly to systems and methods for equalizing signals.

High speed serial communication has become popular and essential in current communication devices. Serializer/deserializer transceivers have been developed to serialize a number (P) of parallel signals each of a given bit rate (B) into a single serial signal with a rate of P*B. The single signal may then be transmitted to a receiver and subsequently deserialized into an output corresponding to the original P parallel signals with the original bit rate B. Common serializer/deserializer transceivers can transmit serial signals up to approximately 10 Gbps. At such high frequencies, channel distortion and attenuation, such as Inter Symbol Interference (ISI), crosstalk, noise, jitter, and the like becomes significant.

In some cases, signal degradation due to one or more of the aforementioned conditions has been partially mitigated in the transmitter portion of a transmitter/receiver system. For example, a common mitigation technique is to pre-emphasize high frequency components of the transmitted signal, or alternatively to de-emphasize low frequency components of the transmitted signal. In some cases, however, such an approach may increase various noise components resulting in an undesirable decrease in signal to noise ratio. Further, such emphasis/de-emphasis approaches may not be sufficient in many systems and channels to permit the receiver to recover the bit sequence.

Channel equalization is used in many systems to determine a correct bit sequence from a received transmission. To determine the correct bit value for a given bit period or a received signal, equalization processes are used to modify a current sampled value of the transmitted signal by a function of the values determined during some number of earlier and/or later bit periods. Thus, data dependencies in the transmitted signal can be used to modify a bit value for a given bit period. Alternatively, or in addition, maximum likelihood detectors may be used to determine the correct bit value during a given bit period by calculating the maximum likelihood of the bit value (e.g., either logic-0 or logic-1) based on the values determined during some number of earlier and/or later bit periods. While such maximum likelihood detectors can be very effective in determining a correct bit sequence, they typically require a great deal of semiconductor area to implement and introduce considerable latency to a data receiving process.

In some cases, analog decision feedback equalizers (analog DFEs) have been utilized in serializer/deserializer transceivers to determine the correct logic value of a sample of a analog input signal for a given bit period in the presence of inter symbol interference. Such analog DFEs are capable of high bandwidth operation, but are typically expensive in terms of both power dissipation and semiconductor area. Equivalent digital circuits are often less power and space intensive. However, existing digital equivalents offer lower bandwidth due to a variety of mathematical operations being accomplished in the digital signal domain. At least in part because of this, many high bandwidth serializer/deserializer transceivers utilize analog DFEs at the cost of higher power dissipation and semiconductor area. In some cases, such a cost is unacceptable.

Hence, for at least the aforementioned reasons, there exists a need in the art for advanced systems and methods for signal equalization.

BRIEF SUMMARY OF THE INVENTION

The present inventions are related to systems and methods for processing digital signals, and more particularly to systems and methods for equalizing signals.

Various embodiments of the present invention provide decision feedback equalizer circuits that include a comparator, two adjustment calculation circuits, and a selector circuit. The comparator compares an input with a selected adjustment value corresponding to a first bit period, and provides a decision output based at least in part on the comparison of the input with the selected adjustment value. The first adjustment calculation circuit is operable to calculate a first adjustment feedback value based at least in part on a speculation that the decision output is a first logic level, and the second adjustment calculation circuit that is operable to calculate a second adjustment feedback value based at least in part on a speculation that the decision output is a second logic level. The selector circuit selects the first adjustment feedback as the selected adjustment value when the decision output is the first logic level, and selects the second adjustment feedback as the selected adjustment value when the decision output is the second logic level.

In some instances of the aforementioned embodiments, the first adjustment calculation circuit and the second adjustment calculation circuit are driven by a storage device. The storage device stores a prior output of the comparator, and the first adjustment feedback value is calculated based at least in part on the prior output of the comparator. In some such instances, the first adjustment feedback value includes the prior output multiplied by an inter symbol interference value corresponding to a bit period of the prior output. In particular cases, the bit period precedes a bit period of the decision output. In some cases, the second adjustment feedback value is calculated by the second adjustment calculation circuit in substantially the same manner as the first adjustment calculation circuit, except that the decision output is speculated to be the second logic level.

Other embodiments of the present invention provide analog to digital converters that include a comparator bank that receives a reference indicator and is operable to provide a decision output based at least in part on a comparison of an analog input with a reference threshold corresponding to the reference indicator. A range selection filter is included that has a first adjustment calculation circuit and a second adjustment calculation circuit. The first adjustment calculation circuit is operable to calculate a first adjustment feedback value based at least in part on a speculation that the decision output is a first logic level, and the second adjustment calculation circuit is operable to calculate a second adjustment feedback value based at least in part on a speculation that the decision output is a second logic level. A selector circuit selects the first adjustment feedback to generate the reference indicator when the decision output is the first logic level, and selects the second adjustment feedback to generate the reference indicator when the decision output is the second logic level. In some instances of the aforementioned embodiments, the comparator bank includes a single comparator, the reference indicator is a voltage offset, and the reference threshold is a reference voltage plus the voltage offset.

Yet other embodiments of the present invention provide communication systems that include speculative digital decision feedback equalizers. As used herein, the phrase "communication system" is used in its broadest sense to mean and system whereby information is transferred from one element to another via a medium. In some cases, the speculative digital decision feedback equalizer is incorporated as a range filter in a dynamic analog to digital converter. Such communication systems may be, but are not limited to, storage systems and wireless communication systems. Based on the disclosure provided herein, one of ordinary skill in the art will recognize a variety of communication systems that may utilize decision feedback equalizers and/or dynamic analog to digital converters in accordance with different embodiments of the present invention.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 2b is a timing diagram depicting an exemplary operation of the speculative digital DFE depicted in FIG. 2a;

FIG. 3b is a timing diagram depicting an exemplary operation of the speculative digital DFE depicted in FIG. 3a;

FIG. 4b is a timing diagram depicting an exemplary operation of the speculative digital DFE depicted in FIG. 4a.

DETAILED DESCRIPTION OF THE INVENTION

The present inventions are related to systems and methods for processing digital signals, and more particularly to systems and methods for equalizing signals.

Figure 1:
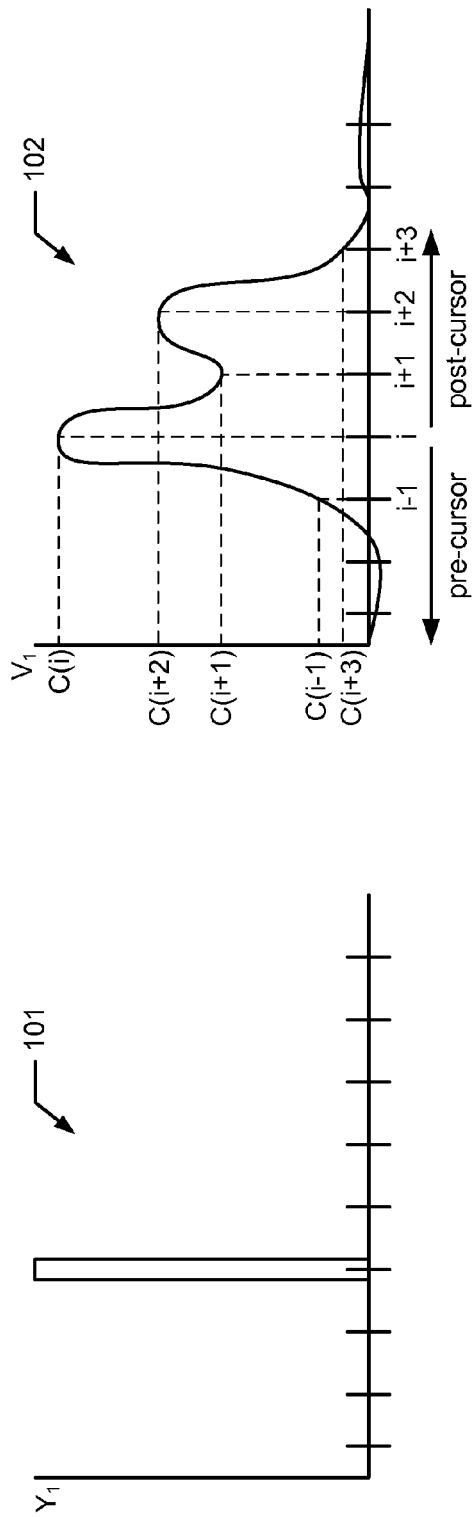
FIG. 1 depicts an exemplary pulse applied to a channel, and a channel response including inter symbol interference to that pulse.

Turning to FIG. 1, an exemplary pulse 101 applied to a channel, and a channel response 102 thereto are depicted. C(i) indicates the magnitude of the impulse response (i.e., cursor); C(i−1) indicates the pre-cursor inter symbol interference at a bit period i−1; and C(i+1), C(i+2) and C(i+3) indicate post-cursor inter symbol interference at bit periods i+1, i+2 and i+3, respectively. From this, it is understood that an analog input signal representing a bit value during bit period i will interfere with the analog input signal during the previous bit period i−1, and during subsequent bit periods i+1, i+2 and i+3. Accordingly, the analog input signal during bit periods i−1, i+1, i+2 and i+3 bit periods will interfere with the analog input signal during bit period i. Thus, to compensate for inter symbol interference, inter symbol interference values corresponding to the aforementioned bit periods can be summed and subtracted from the analog input signal during bit period i. The sum of the relevant inter symbol interference values is referred to herein as an adjustment factor or adjustment feedback. In general, the adjustment factor can be found by multiplying the sampled bit value (logic '0' or logic '1') determined during relevant bit periods with the respective coefficient found from the impulse response. The adjusted analog input signal is then be sampled using a comparator. This process may be used to determine the correct logic value of a sample of an analog input signal in the presence of inter symbol interference.

Figure 2A:
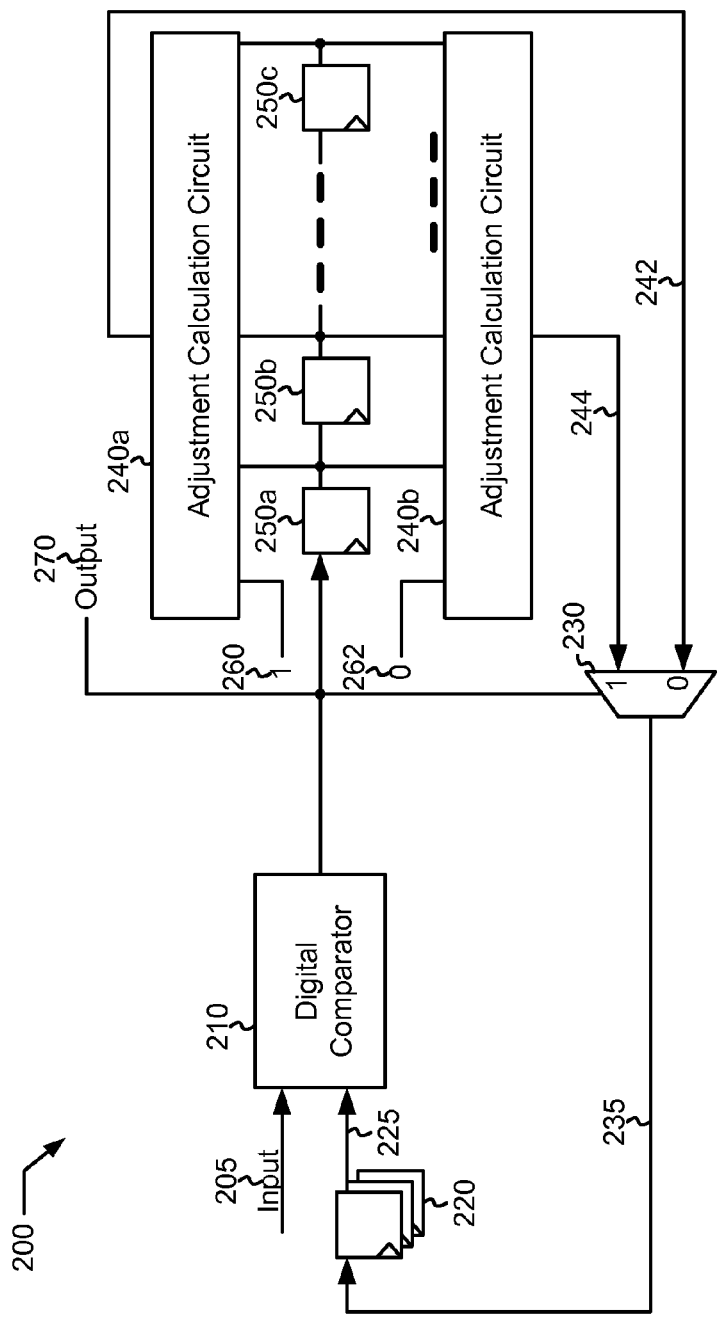
FIG. 2a depicts a speculative digital DFE in accordance with various embodiments of the present invention.

Turning to FIG. 2a, a speculative digital DFE circuit 200 is shown in accordance with various embodiments of the present invention. Speculative DFE circuit 200 is operable to reduce inter symbol interference such as that described above in FIG. 1 without the timing constraints exhibited by existing DFE circuits. In particular, speculative digital DFE circuit 200 operates to pre-calculate two competing adjustment feedback values—one based on a speculation that the result from processing the succeeding bit (i.e., a decision output) will be logic '1' and the other based on a speculation that the result from processing the succeeding bit will be logic '0'. Once the result from the succeeding bit is available, the pre-calculated adjustment feedback value corresponding to the correctly speculated output value can be immediately selected to process the following input bits. In this way, latency between determination of a succeeding bit and providing a data dependent input for processing a following bit can be greatly reduced as the time required to perform adjustment calculations is effectively eliminated from the latency.

Speculative DFE circuit 200 receives an input 205 (i.e., input[m . . . 0]) at a digital comparator 210. Digital comparator 210 also receives an adjustment input 225 (i.e., adjust[p . . . 0]) that was derived from previously received inputs 205. Digital comparator 210 compares input 205 with adjustment input 225 and provides a single bit decision output 270 in accordance with the following pseudocode:

```
If ((input[m..0] − adjust[p..0]) <= 0)
{
        Output Bit = 0
}
Else If ((input[m..0] − adjust[p..0]) > 0)
{
        Output Bit = 1
}
```

Output bit 270 is fed to a shift register including a number (j) of flip-flops 250a, 250b, 250c. In particular, flip-flop 250a receives output bit 390 from a preceding bit period synchronized to a clock signal (not shown) and flip-flop 250b receives the output of flip-flop 250a synchronized to the same clock signal. The output of flip-flop 350b is provided to a succeeding flip-flop, and flip-flop 250c receives the output of a preceding flip-flop synchronized to the same clock signal. The outputs of flip-flops 250 are used to generate respective speculative feedback 242, 244. In particular, an adjustment calculation circuit 240a performs an adjustment calculation based on a speculated logic '1' input 260 and the outputs of flip-flops 250 to yield speculative feedback 242; and an adjustment calculation circuit 240b performs the same adjustment calculation based on a speculated logic '0' input 262 and the outputs of flip-flops 250 to yield speculative feedback 244.

Adjustment calculation circuit 240a may perform a standard DFE mathematical equation where the output of flip-flop 250a is multiplied by an n-bit digital representation of the inter symbol interference value corresponding to bit time i+2, the output of flip-flop 250b is multiplied by an n-bit digital representation of the inter symbol interference value corresponding to bit time i+3, and the output of flip-flop 250c is multiplied by an n-bit digital representation of the inter symbol interference value corresponding to bit time i+x. The product of each of the aforementioned multiplications may then be summed together and added to an n-bit digital representation of the inter symbol interference value corresponding to bit time i+1. The result of the summation is provided as speculative feedback 242. It should be noted that the multiplication and summation processes may be performed using pre-computed values retrieved from a lookup table, through use of dedicated multiplication and summation circuitry, or some combination thereof. By adding the inter symbol interference value corresponding to bit time i+1, speculative feedback 242 represents the calculated feedback where decision output 270 is found to be a logic '1'.

Similarly, adjustment calculation circuit 240b may perform a standard DFE mathematical equation where the output of flip-flop 250a is multiplied by an n-bit digital representation of the inter symbol interference value corresponding to bit time i+2, the output of flip-flop 250b is multiplied by an n-bit digital representation of the inter symbol interference value corresponding to bit time i+3, and the output of flip-flop 250c is multiplied by an n-bit digital representation of the inter symbol interference value corresponding to bit time i+x. The product of each of the aforementioned multiplications may then be summed together. The result of the summation is provided as speculative feedback 244. Again, it should be noted that the multiplication and summation processes may be performed using pre-computed values retrieved from a lookup table, through use of dedicated multiplication and summation circuitry, or some combination thereof. By not adding the inter symbol interference value corresponding to bit time i+1, speculative feedback 244 represents the calculated feedback where decision output 270 is found to be a logic '0'

Once decision output 270 is available from digital comparator 210, either speculative feedback 242 or speculative feedback 244 is selected to be stored in an input register 220. In particular, if decision output 270 is found to be a logic '1' speculative feedback 242 is selected by a multiplexer 230. If decision output 270 is found to be a logic '0' speculative feedback 244 is selected by a multiplexer 230. An adjustment output 235 is provided as an input to register 220. Input register 220 may be any register or memory element that is capable of synchronizing a received input to a desired timing of a corresponding output. Input register 220 is used to assure that adjustment output 235 is provided to digital comparator 210 only after the next clock edge indicating the next bit period, and assures that adjustment output 235 is not applied to comparator 210 in such a way that an asynchronous feedback loop exists.

Figure 2B:
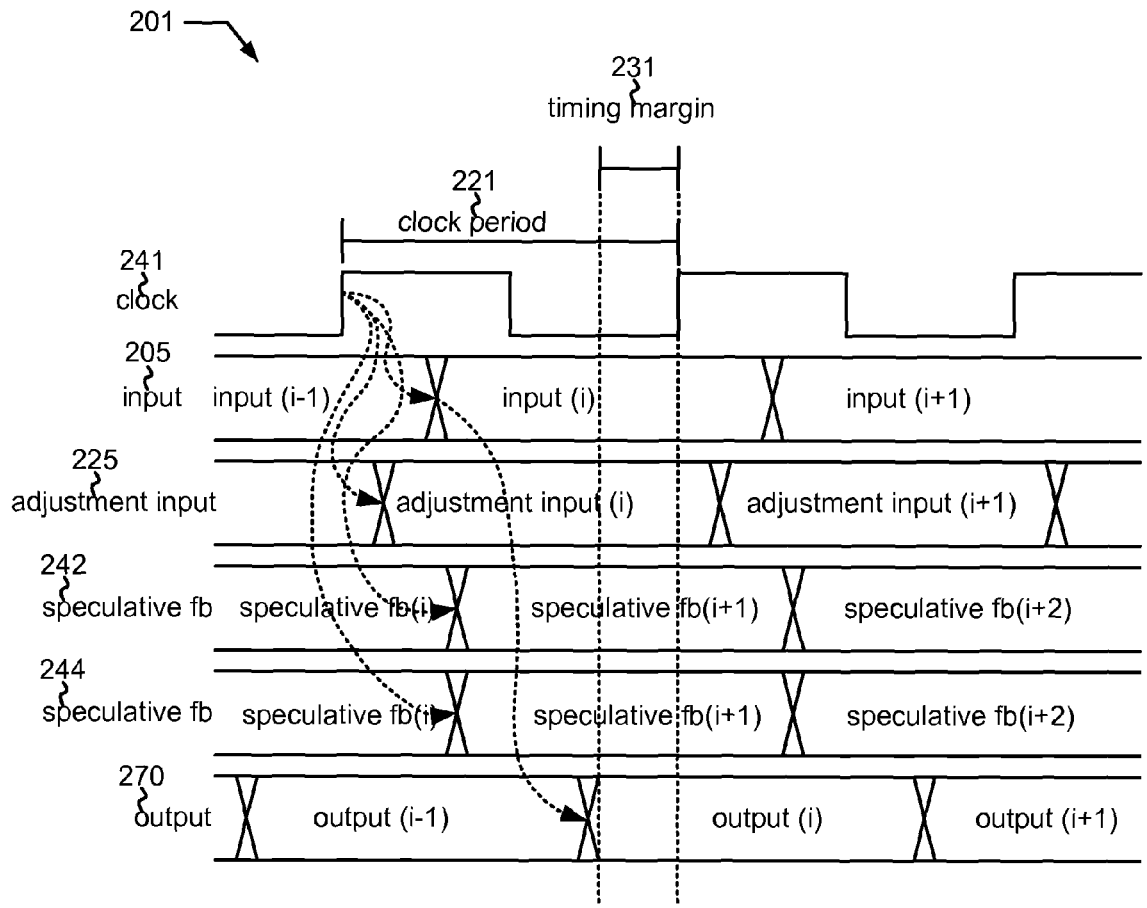

Turning to FIG. 2b, a timing diagram 201 depicts an exemplary operation of speculative digital DFE 200. Following timing diagram 201, processes are synchronized to a clock 241 with a clock period 221. An input 205 is received (i.e., input (i)). Prior to receiving input 205, an adjustment input 225 (i.e., adjustment input(i)) is registered and stable based on a previously determined decision output 270 (i.e., output (i−1)). Adjustment input 225 is selected to be one of speculative feedback 242 (i.e., speculative feedback (i)) or speculative feedback 244 (i.e., speculative feedback (i)) depending upon decision output 270. Adjustment input 225 is registered based on clock 241. A timing margin 231 provides a nonnegative time period where both input (i) and adjustment input (i) are stable for comparison. The comparison results in output (i) which can then be used to select which of speculative feedback 242 or speculative feedback 244 is used on the succeeding rising edge of clock 241 to latch adjustment input 225 (i.e., adjustment input (i+1)). As input 205 (i.e., input (i)) is being compared with adjustment input 225 (i.e., adjustment input (i)), the succeeding speculative feedback values 242, 244 are being calculated. Using this approach to pre-calculating the adjustment values based on speculative decision making, the latency from when decision output 270 is available until adjustment input 225 is registered (i.e., until an adjustment value is ready for comparison with input 205) is greatly reduced. This allows for higher bandwidth operation of the DFE, and in some cases allows for using speculative DFE circuit 200 in place of an analog DFE.

As more fully described in U.S. patent application Ser. No. 12/134,488 entitled "Systems and Methods for Analog to Digital Conversion" and filed on a date even herewith by Chmelar, a digital DFE may be combined with a dynamic analog to digital converter in such a way that the comparison function (e.g., digital comparator 210) of the DFE is eliminated. The entirety of the aforementioned reference is incorporated herein by reference for all purposes. Elimination of the comparison function allows the DFE to operate at even faster speeds as another layer of logic is eliminated from the critical timing path.

Figure 3A:
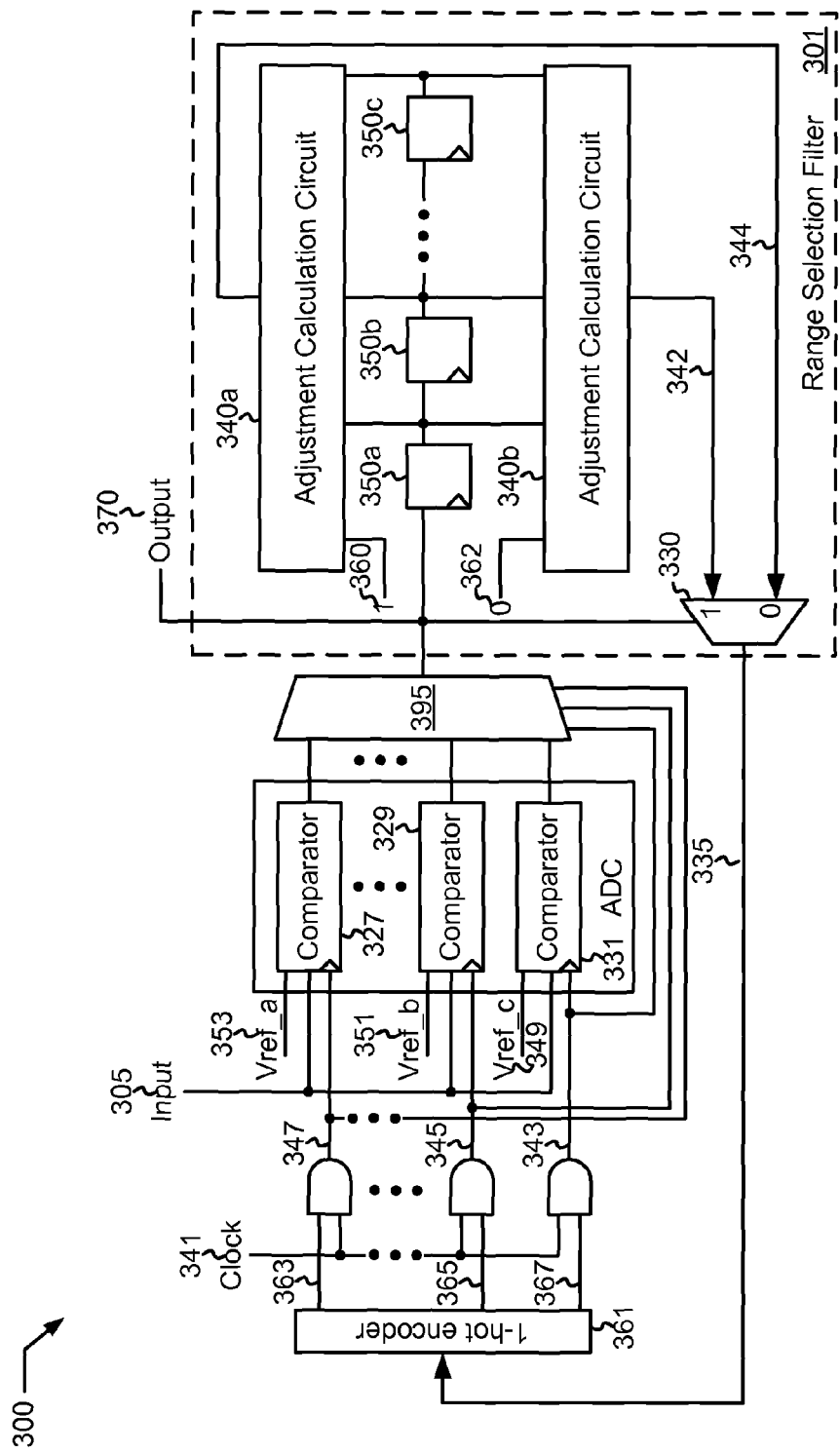
FIG. 3a depicts a speculative digital DFE incorporated into a dynamic range analog to digital converter in accordance with various embodiments of the present invention.

Turning to FIG. 3a, a speculative digital DFE circuit is used as a range selection filter 301 and incorporated into a dynamic analog to digital converter 300 in accordance with various embodiments of the present invention. Dynamic analog to digital converter 300 includes range selection filter 301 (shown in dashed lines) that is implemented as a speculative digital DFE. Dynamic analog to digital converter 300 includes a number of comparators 331, 329, 327 that each receive a respective voltage reference 349, 351, 353 distributed across an input range of dynamic analog to digital comparator 300. When enabled, comparators 331, 329, 327 each compare their respective voltage reference with an analog input 305. A particular subset of comparators 331, 329, 327 is enabled during a given bit period by a respective one of bit enables 343, 345, 347. Bit enables 343, 345, 347 are asserted for a period of a clock signal 341 by logically ANDing enable signals 367, 365, 363 provided from a 1-hot encoder circuit 361 with clock 341. 1-hot encoder circuit 361 asserts only one of enables 367, 365, 363 during any bit period, and thereby selects only a single comparator of comparators 331, 329, 327. By selectively asserting bit enables 343, 345, 347, a particular input range for dynamic analog to digital converter 300 may be selected. The non-selected comparators remain in an idle state allowing for the conservation of power. In addition, bit enables 343, 345, 347 are provided to a multiplexer 395 that provides a decision output 370 to be driven by the selected comparator. It should be noted that while FIG. 3a depicts three comparators and associated circuits and signals, that any number of comparators and associated circuits and signals are possible in accordance with different embodiments of the present invention.

Range selection filter 301 includes a shift register formed of a number of flip-flops 350a, 350b, 350c. In particular, flip-flop 350a receives decision output 370 from a preceding bit period synchronized to a clock signal (not shown) and flip-flop 350b receives the output of flip-flop 350a synchronized to the same clock signal. The output of flip-flop 350b is provided to a succeeding flip-flop, and flip-flop 350c receives the output of a preceding flip-flop synchronized to the same clock signal. The outputs of flip-flops 350 are used to generate respective speculative feedback 342, 344. In particular, an adjustment calculation circuit 340a performs an adjustment calculation based on a speculated logic '1' input 360 and the outputs of flip-flops 350 to yield speculative feedback 342; and an adjustment calculation circuit 340b performs the same adjustment calculation based on a speculated logic '0' input 362 and the outputs of flip-flops 350 to yield speculative feedback 344.

Adjustment calculation circuit 340a may perform a standard DFE mathematical equation where the output of flip-flop 350a is multiplied by an n-bit digital representation of the inter symbol interference value corresponding to bit time i+2, the output of flip-flop 350b is multiplied by an n-bit digital representation of the inter symbol interference value corresponding to bit time i+3, and the output of flip-flop 350c is multiplied by an n-bit digital representation of the inter symbol interference value corresponding to bit time i+x. The product of each of the aforementioned multiplications may then be summed together and added to an n-bit digital representation of the inter symbol interference value corresponding to bit time i+1. The result of the summation is provided as speculative feedback 342. It should be noted that the multiplication and summation processes may be performed using pre-computed values retrieved from a lookup table, through use of dedicated multiplication and summation circuitry, or some combination thereof. By adding the inter symbol interference value corresponding to bit time i+1, speculative feedback 342 represents the calculated feedback where decision output 370 is found to be a logic '1'.

Similarly, adjustment calculation circuit 340b may perform a standard DFE mathematical equation where the output of flip-flop 350a is multiplied by an n-bit digital representation of the inter symbol interference value corresponding to bit time i+2, the output of flip-flop 350b is multiplied by an n-bit digital representation of the inter symbol interference value corresponding to bit time i+3, and the output of flip-flop 350c is multiplied by an n-bit digital representation of the inter symbol interference value corresponding to bit time i+x. The product of each of the aforementioned multiplications may then be summed together. The result of the summation is provided as speculative feedback 344. Again, it should be noted that the multiplication and summation processes may be performed using pre-computed values retrieved from a lookup table, through use of dedicated multiplication and summation circuitry, or some combination thereof. By not adding the inter symbol interference value corresponding to bit time i+1, speculative feedback 344 represents the calculated feedback where decision output 370 is found to be a logic '0'.

Once decision output 370 is available from multiplexer 395, either speculative feedback 342 or speculative feedback 344 is selected as adjustment output 335 using a multiplexer 330. In particular, if decision output 370 is found to be a logic '1' speculative feedback 342 is selected by a multiplexer 330. If decision output 370 is found to be a logic '0' speculative feedback 344 is selected by a multiplexer 330. Adjustment output 335 may be used directly by 1-hot encoder 361 to determine the range of dynamic analog to digital converter 300 that will be used during a subsequent bit period. Said another way, adjustment output 335 may be used directly to select which subset of comparators 331, 329, 327 are to be activated during a subsequent bit period. This circumvents the need for digital comparator 210 and reduces adjustment calculation circuits 340 to a set of digital multiplier circuits that multiply the outputs of flip-flops 350a, 350b, 350c by their respective inter symbol interference values, and a set of digital adder circuits. The output of the aforementioned digital adder circuits can be used as the respective speculative feedback outputs 342, 244. It should be noted that in some cases, the aforementioned digital multiplier circuits and digital adder circuits may be eliminated through the use of well known methods of pre-computing the products and summation via a look-up table. This further enhances the speed of range selection filter 301.

Figure 3B:
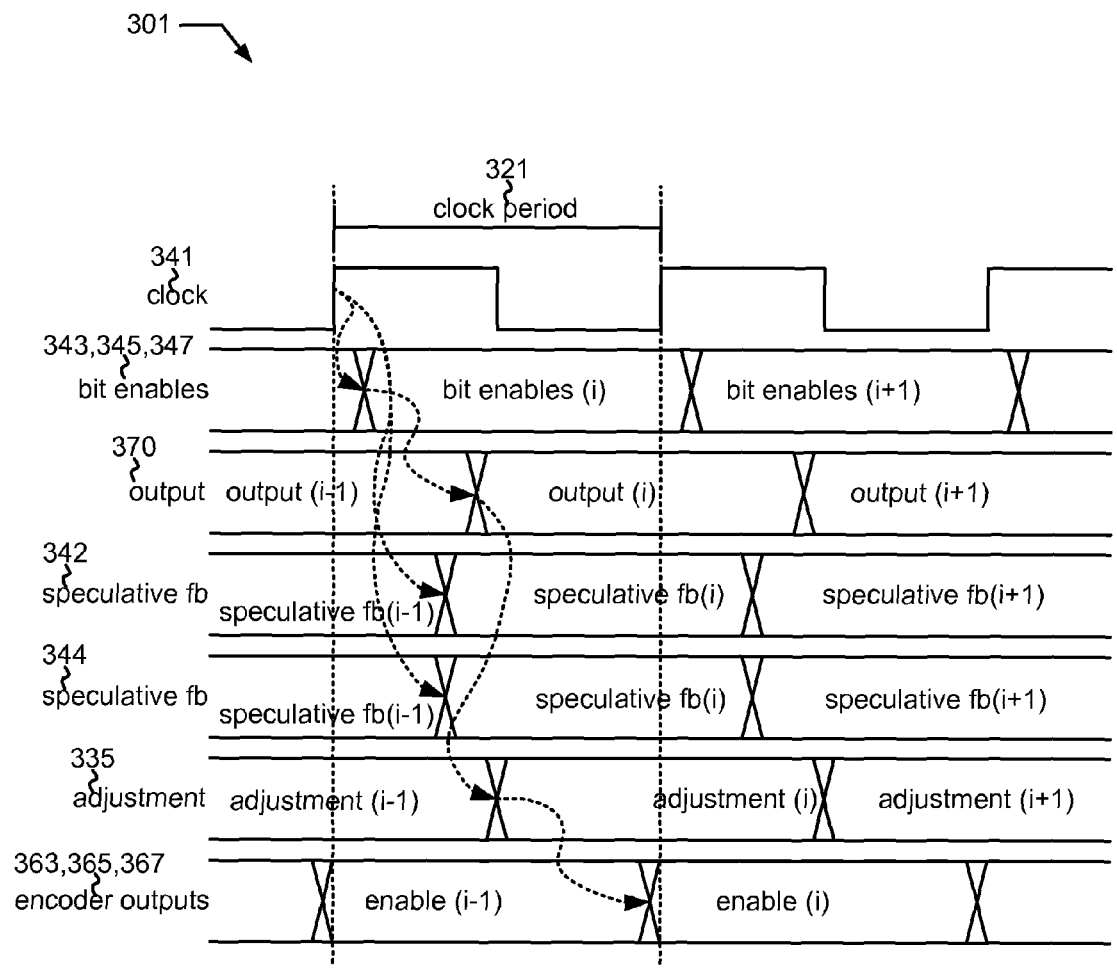

Turning to FIG. 3b, a timing diagram 301 depicts an exemplary operation of dynamic analog to digital converter 300. Following timing diagram 301, processes are synchronized to a clock 341 with a clock period 321. As shown, bit enables 343, 345, 347 for the succeeding comparison become stable shortly after a rising edge of clock 341. Bit enables 343, 345, 347 are based on prior outputs 367, 365, 363 from 1-hot encoded 361. Based on bit enables 343, 345, 347, decision output 370 resolves some delay period later. In parallel with the resolution of decision output 370, flip-flops 350 are clocked using the rising edge of clock 341 and allowing for speculative feedback 342 and speculative feedback 344 to be resolved. Once decision output 370 is resolved, one or the other of speculative output 342 or speculative output 344 is selected. The selected speculative output is then used to drive the appropriate adjustment input 335 to create encoder outputs 367, 365, 363.

Figure 4A:
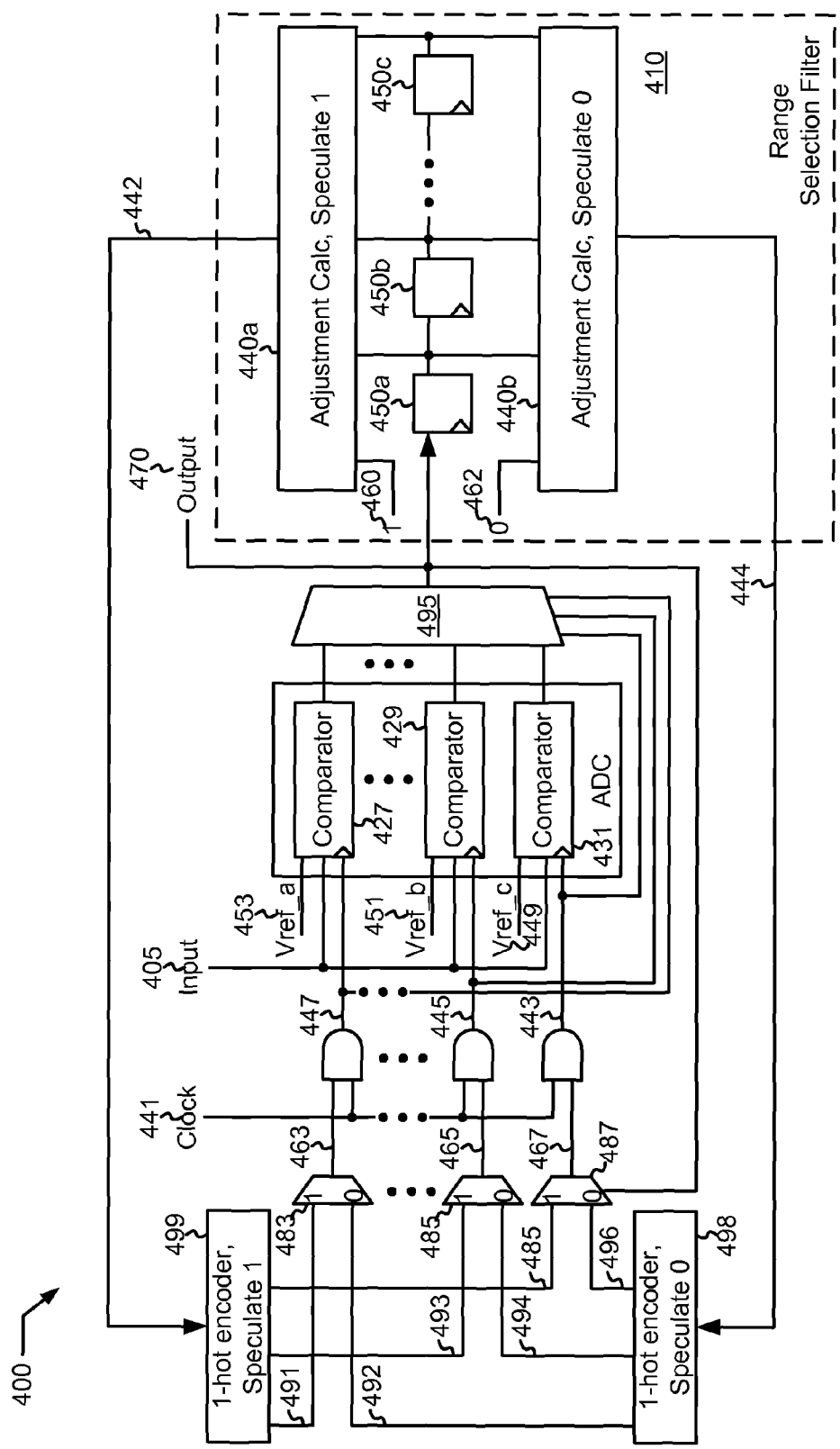
FIG. 4a depicts a speculative digital DFE incorporated into a dynamic range analog to digital converter in accordance with other embodiments of the present invention.

It may be desirable to achieve even greater timing margin and thereby to increase the operational bandwidth of dynamic analog to digital converter 300 of FIG. 3a. FIG. 4a, depicts a dynamic analog to digital converter 400 that provides for additional timing margin when compared with dynamic analog to digital converter 300. In particular, dynamic digital to analog converter 400 includes a speculative digital DFE circuit used as a range selection filter 410 (shown in dashed lines) in accordance with various embodiments of the present invention. Dynamic analog to digital converter 400 includes a number of comparators 431, 429, 427 that each receive a respective voltage reference 449, 451, 453 distributed across an input range of dynamic analog to digital comparator 400. When enabled, comparators 431, 429, 427 each compare their respective voltage reference with an analog input 405. A particular subset of comparators 431, 429, 427 is enabled during a given bit period by a respective one of bit enables 443, 445, 447. Bit enables 443, 445, 447 are asserted for a period of a clock signal 441 by logically ANDing enable signals 467, 465, 463 provided from respective multiplexers 483, 485, 487. Each of multiplexers 483, 485, 487 receives a respective one of speculative encoder outputs 491, 493, 495 and a corresponding respective one of speculative encoder outputs 492, 494, 496. Multiplexers 483, 485, 487 select between the respective speculative encoder outputs based on a decision output 470 from a multiplexer 495.

A 1-hot encoder 499 asserts only one of speculative encoder outputs 491, 493, 495 based on a speculative feedback 442 and a speculation that decision output 470 is a logic '1'; and a 1-hot encoder 499 asserts only one of speculative encoder outputs 492, 494, 496 based on a speculative feedback 444 and a speculation that decision output 470 is a logic '0'. Thus, only one of speculative encoder outputs 491, 493, 495 and only one of speculative encoder outputs 492, 494, 496 are asserted during any bit period. One of the asserted speculative encoder outputs is selected by multiplexers 483, 485, 487 such that only a single comparator of comparators 431, 429, 427 is enabled for comparison on the subsequent bit period. By selectively asserting bit enables 443, 445, 447, a particular input range for dynamic analog to digital converter 400 may be selected. The non-selected comparators remain in an idle state allowing for the conservation of power. In addition, bit enables 443, 445, 447 are provided to multiplexer 495 to generate decision output 470. It should be noted that while FIG. 4a depicts three comparators and associated circuits and signals, that any number of comparators and associated circuits and signals are possible in accordance with different embodiments of the present invention.

Range selection filter 401 includes a shift register formed of a number of flip-flops 450a, 450b, 450c. In particular, flip-flop 450a receives decision output 470 from a preceding bit period synchronized to a clock signal (not shown) and flip-flop 450b receives the output of flip-flop 450a synchronized to the same clock signal. The output of flip-flop 450b is provided to a succeeding flip-flop, and flip-flop 450c receives the output of a preceding flip-flop synchronized to the same clock signal. The outputs of flip-flops 450 are used to generate respective speculative feedback 442, 444. In particular, an adjustment calculation circuit 440a performs an adjustment calculation based on a speculated logic '1' input 460 and the outputs of flip-flops 450 to yield speculative feedback 442; and an adjustment calculation circuit 440b performs the same adjustment calculation based on a speculated logic '0' input 462 and the outputs of flip-flops 450 to yield speculative feedback 444.

Adjustment calculation circuit 440a may perform a standard DFE mathematical equation where the output of flip-flop 450a is multiplied by an n-bit digital representation of the inter symbol interference value corresponding to bit time i+2, the output of flip-flop 450b is multiplied by an n-bit digital representation of the inter symbol interference value corresponding to bit time i+3, and the output of flip-flop 450c is multiplied by an n-bit digital representation of the inter symbol interference value corresponding to bit time i+x. The product of each of the aforementioned multiplications may then be summed together and added to an n-bit digital representation of the inter symbol interference value corresponding to bit time i+1. The result of the summation is provided as speculative feedback 442. It should be noted that the multiplication and summation processes may be performed using pre-computed values retrieved from a lookup table, through use of dedicated multiplication and summation circuitry, or some combination thereof. By adding the inter symbol interference value corresponding to bit time i+1, speculative feedback 442 represents the calculated feedback where decision output 470 is found to be a logic '1'.

Similarly, adjustment calculation circuit 440b may perform a standard DFE mathematical equation where the output of flip-flop 450a is multiplied by an n-bit digital representation of the inter symbol interference value corresponding to bit time i+2, the output of flip-flop 450b is multiplied by an n-bit digital representation of the inter symbol interference value corresponding to bit time i+3, and the output of flip-flop 450c is multiplied by an n-bit digital representation of the inter symbol interference value corresponding to bit time i+x. The product of each of the aforementioned multiplications may then be summed together. The result of the summation is provided as speculative feedback 444. Again, it should be noted that the multiplication and summation processes may be performed using pre-computed values retrieved from a lookup table, through use of dedicated multiplication and summation circuitry, or some combination thereof. By not adding the inter symbol interference value corresponding to bit time i+1, speculative feedback 444 represents the calculated feedback where output 370 is found to be a logic '0'. As discussed above, speculative feedback 442 is provided to 1-hot encoder 499 that asserts only one of speculative encoder outputs 491, 493, 495. Similarly, speculative feedback 444 is provided to 1-hot encoder 498 that asserts only one of speculative encoder outputs 492, 494, 496. By providing two 1-hot encoders 498, 499 and two adjustment calculation circuits 440, the process of speculation may be continued closer to comparators 431, 429, 427 allowing a larger time for decision output 470 to stabilize.

Once decision output 470 is available from multiplexer 495, either one of speculative encoder outputs 491, 493, 495 (depending upon the assertion level of speculative feedback 442) or one of speculative encoder outputs 492, 494, 496 (depending upon the assertion level of speculative feedback 444) is selected using multiplexers 483, 485, 487. In particular, if decision output 470 is found to be a logic '1', one of speculative encoder outputs 491, 493, 495 is selected depending upon the assertion level of speculative feedback 442. Alternatively, if decision output 470 is found to be a logic '0', one of speculative encoder outputs 492, 494, 496 is selected depending upon the assertion level of speculative feedback 444. Thus, the output of adjustment calculation circuits 440 in combination with the resolved value of decision output 470 determine the range of dynamic analog to digital converter 400 that will be used during a subsequent bit period.

Figure 4B:
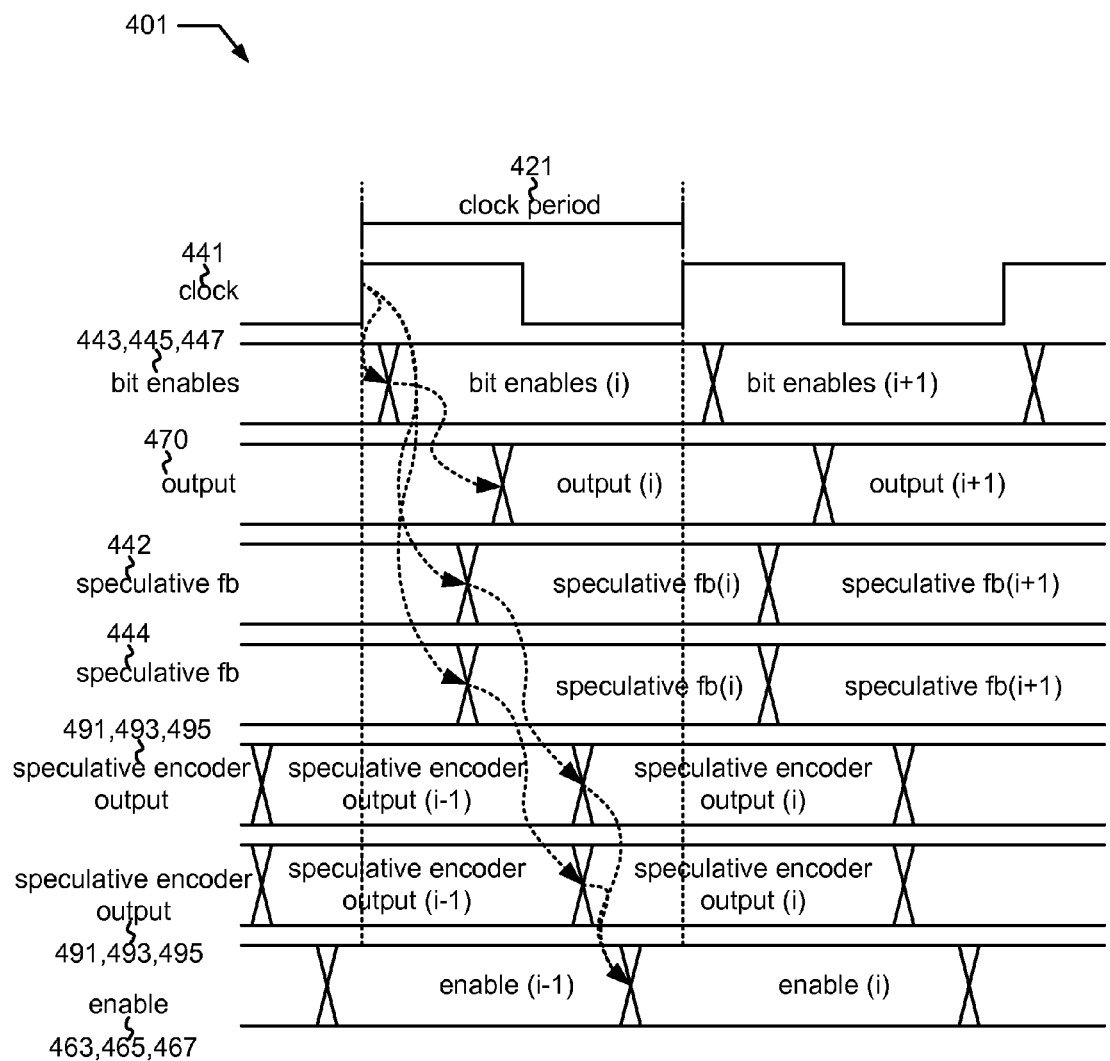

Turning to FIG. 4b, a timing diagram 401 depicts an exemplary operation of dynamic analog to digital converter 400. Following timing diagram 401, processes are synchronized to clock 441 with a clock period 421. As shown, bit enables 443, 445, 447 for the succeeding comparison become stable shortly after a rising edge of clock 441. Bit enables 443, 445, 447 control which comparator 431, 429, 427 will drive decision output 470 via multiplexer 495. Bit enables 443, 445, 447 are based on the selection between speculative encoder outputs 491, 492, 493, 494, 495, 496 by application of decision output 470 to multiplexers 483, 485, 487. Speculative encoder outputs 491, 492, 493, 494, 495, 496 are driven by 1-hot encoders 498, 499 and become stable shortly after the respective transitions of speculative feedback 442, 444. Speculative feedback 442, 444 are updated after each rising edge of clock 441 causes decision output 470 to be stored in flip-flop 350a.

Figure 5:
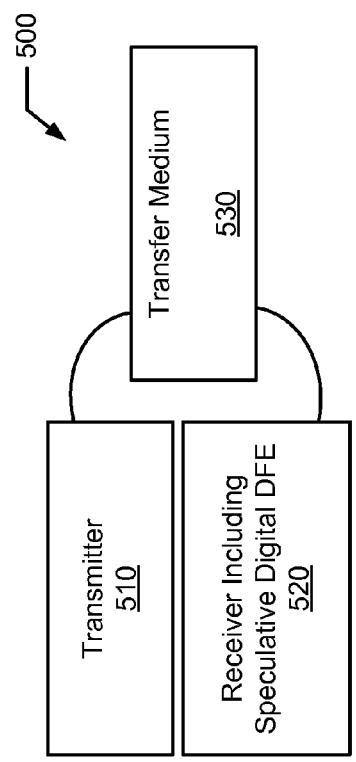
FIG. 5 depicts a data transfer system including a speculative digital DFE in accordance with one or more embodiments of the present invention.

Turning to FIG. 5, a communication system 500 including a receiver 520 with a speculative digital DFE is shown in accordance with some embodiments of the present invention. Communication system 500 includes a transmitter 510 that transmits a signal representing a data set to receiver 520 via a transfer medium 530. Transfer medium 530 may be, but is not limited to, a wireless transfer medium, a electrically wired transfer medium, a magnetic storage medium, or an optical transfer medium. Based on the disclosure provided herein, one of ordinary skill in the art will recognize a variety of transfer media that may be used in relation to different embodiments of the present invention. Receiver 520 includes a speculative digital DFE circuit similar to those described above in relation to FIG. 2a, FIG. 3a or FIG. 4a. In some cases, communication system 500 may be a cellular telephone system with transmitter 510 and receiver 520 being cell phones and/or cell towers. Alternatively, communication system 500 may be a magnetic storage medium with transmitter 510 being a write function, transfer medium 530 being a magnetic storage medium, and receiver 520 being a read function. Based on the disclosure provided herein, one of ordinary skill in the art will recognize a variety of other systems that may be represented as communication system 500 in accordance with different embodiments of the present invention.

In conclusion, the invention provides novel systems, devices, methods and arrangements for equalizing signals. While detailed descriptions of one or more embodiments of the invention have been given above, various alternatives, modifications, and equivalents will be apparent to those skilled in the art without varying from the spirit of the invention. For example, while different embodiments of the present invention have been depicted with a particular number of bits of speculation, it will be understood that an arbitrary number of bits of speculation may be supported in accordance with different embodiments of the present invention. Therefore, the above description should not be taken as limiting the scope of the invention, which is defined by the appended claims.

What is claimed is:

1. A decision feedback equalizer circuit, the circuit comprising:
    a comparator, wherein the comparator is operable to compare an input with a selected adjustment value corresponding to a first bit period, and to provide a decision output based at least in part on the comparison of the input with the selected adjustment value;
    a storage device operable to store a prior output of the comparator;
    a first adjustment calculation circuit that is operable to calculate a first adjustment feedback value based at least in part on the prior output of the comparator;
    a second adjustment calculation circuit that is operable to calculate a second adjustment feedback value based at least in part on the prior output of the comparator;
    a selector circuit, wherein the selector circuit is operable to select the first adjustment feedback as the selected adjustment value when the decision output is the first logic level, and wherein the selector circuit is operable to select the second adjustment feedback as the selected adjustment value when the decision output is the second logic level; and
    wherein at least one of the first adjustment feedback value and the second adjustment feedback value includes the prior output multiplied by an inter symbol interference value corresponding to a bit period of the prior output.

2. The circuit of claim 1, wherein the first adjustment feedback value includes the prior output multiplied by an inter symbol interference value corresponding to a bit period of the prior output.

3. The circuit of claim 2, wherein the bit period precedes a bit period of the decision output.

4. The circuit of claim 3, wherein the prior output is a first prior output, wherein the bit period is a first bit period, wherein the first adjustment feedback value is generated at least in part based on the first prior output and a second prior output of the comparator, wherein the storage device stores both the first prior output and the second prior output, and wherein the first adjustment calculation circuit multiplies the first prior output by a first inter symbol interference value corresponding to the first bit period and multiplies the second prior output by a second inter symbol interference value corresponding to a second bit period, and wherein the first adjustment feedback value includes a sum of the product of multiplying the first prior output by the first inter symbol interference value and the product of multiplying the second prior output by the second inter symbol interference value.

5. The circuit of claim 1, wherein the second adjustment feedback value includes the prior output multiplied by an inter symbol interference value corresponding to a bit period of the prior output.

6. The circuit of claim 5, wherein the prior output is a first prior output, wherein the bit period is a first bit period, wherein the second adjustment feedback value is calculated at least in part based on the first prior output and a second prior output of the comparator, wherein the storage device stores both the first prior output and the second prior output, and wherein the first adjustment calculation circuit multiplies the first prior output by a first inter symbol interference value corresponding to the first bit period and multiplies the second prior output by a second inter symbol interference value corresponding to a second bit period, and wherein the first adjustment feedback value includes a sum of the product of multiplying the first prior output by the first inter symbol interference value and the product of multiplying the second prior output by the second inter symbol interference value.

7. The circuit of claim 1, wherein the selector is a multiplexer, and wherein a select input of the multiplexer is driven by the decision output.

8. The circuit of claim 1, wherein the circuit further includes a synchronizing register, and wherein the selected adjustment value is synchronized by the synchronizing register.

9. An analog to digital conversion circuit, the circuit comprising:
    an analog input;
    a comparator bank, wherein the comparator bank is operable to receive a reference indicator, and wherein the comparator bank is operable to provide a decision output based at least in part on a comparison of the analog input with a reference threshold at a time governed at least in part by the reference indicator; and
    a range selection filter, wherein the range selection filter includes:
        a first adjustment calculation circuit that is operable to calculate a first adjustment feedback value based at least in part on a speculation that the decision output is a first logic level, wherein the first adjustment feedback value includes a prior output of the comparator bank multiplied by an inter symbol interference value corresponding to a bit period of the prior output;
        a second adjustment calculation circuit that is operable to calculate a second adjustment feedback value based at least in part on a speculation that the decision output is a second logic level; and
        a selector circuit, wherein the selector circuit selects the first adjustment feedback to generate the reference indicator when the decision output is the first logic level, and wherein the selector circuit selects the second adjustment feedback to generate the reference indicator when the decision output is the second logic level.

10. The circuit of claim 9, wherein the comparator bank includes a single comparator, wherein the reference indicator is a voltage offset, and wherein the reference threshold is a reference voltage plus the voltage offset.

11. The circuit of claim 10, wherein the first adjustment calculation circuit and the second adjustment calculation circuit are driven by a storage device, wherein the storage device is operable to store the prior output of the comparator bank, and wherein the first adjustment feedback value is calculated based at least in part on the prior output of the comparator bank.

12. The circuit of claim 11, wherein the bit period precedes a bit period of the decision output.

13. The circuit of claim 12, wherein the prior output is a first prior output, wherein the bit period is a first bit period, wherein the first adjustment feedback value is generated at least in part based on the first prior output and a second prior output of the comparator bank, wherein the storage device stores both the first prior output and the second prior output, and wherein the first adjustment calculation circuit multiplies the first prior output by a first inter symbol interference value corresponding to the first bit period and multiplies the second prior output by a second inter symbol interference value corresponding to a second bit period, and wherein the first adjustment feedback value includes a sum of the product of multiplying the first prior output by the first inter symbol interference value and the product of multiplying the second prior output by the second inter symbol interference value.

14. The circuit of claim 11, wherein the second adjustment feedback value includes the prior output multiplied by an inter symbol interference value corresponding to a bit period of the prior output.

15. The circuit of claim 14, wherein the prior output is a first prior output, wherein the bit period is a first bit period, wherein the second adjustment feedback value is calculated at least in part based on the first prior output and a second prior output of the comparator bank, wherein the storage device stores both the first prior output and the second prior output, and wherein the first adjustment calculation circuit multiplies the first prior output by a first inter symbol interference value corresponding to the first bit period and multiplies the second prior output by a second inter symbol interference value corresponding to a second bit period, and wherein the first adjustment feedback value includes a sum of the product of multiplying the first prior output by the first inter symbol interference value and the product of multiplying the second prior output by the second inter symbol interference value.

16. The circuit of claim 10, wherein the selector is a multiplexer, and wherein a select input of the multiplexer is driven by the decision output.

17. The circuit of claim 10, wherein the selector includes a first encoder, a second encoder, and a multiplexer; wherein the first encoder receives the first adjustment feedback value and generates a first speculative encoder output based on the first adjustment feedback value and a speculation that the decision output is the first logic level; wherein the second encoder receives the second adjustment feedback value and generates a second speculative encoder output based on the second adjustment feedback value and a speculation that the decision output is the second logic level; wherein the first speculative encoder output and the second speculative encoder output are provided as inputs to the multiplexer; and wherein the multiplexer provides the first speculative encoder output as the reference indicator when the decision output is the first logic level; and wherein the multiplexer provides the second speculative encoder output as the reference indicator when the decision output is the second logic level.

18. A communication system, the system comprising:
a receiver including an analog to digital converter, wherein the analog to digital converter includes:
a comparator bank, wherein the comparator bank is operable to receive a reference indicator, and wherein the comparator bank is operable to provide a decision output based at least in part on a comparison of the analog input with a reference threshold at a time governed at least in part by the reference indicator; and
a range selection filter, wherein the range selection filter includes:
a first adjustment calculation circuit that is operable to calculate a first adjustment feedback value based at least in part on a speculation that the decision output is a first logic level;
a second adjustment calculation circuit that is operable to calculate a second adjustment feedback value based at least in part on a speculation that the decision output is a second logic level, wherein the second adjustment feedback value includes a prior output of the comparator bank multiplied by an inter symbol interference value corresponding to a bit period of the prior output;
wherein the first adjustment calculation circuit and the second adjustment calculation circuit are driven by a storage device, wherein the storage device is operable to store the prior output of the comparator bank; and
a selector circuit, wherein the selector circuit selects the first adjustment feedback to generate the reference indicator when the decision output is the first logic level, and wherein the selector circuit selects the second adjustment feedback to generate the reference indicator when the decision output is the second logic level.

19. The communication system of claim 18, wherein the communication system is a storage system operable to transfer information via a storage medium.

20. The communication system of claim 18, wherein the communication system is a wireless communication system, and wherein the wireless communication system is operable to transfer information via a wireless medium.

21. The circuit of claim 1, wherein the circuit is implemented as part of a storage device.

22. The circuit of claim 1, wherein the circuit is implemented as part of a wireless data transfer device.

23. The circuit of claim 9, wherein the circuit is implemented as part of a storage device.

24. The circuit of claim 9, wherein the circuit is implemented as part of a wireless data transfer device.

* * * * *